United States Patent
Cho

(10) Patent No.: US 11,901,384 B2
(45) Date of Patent: Feb. 13, 2024

(54) CMOS IMAGE SENSOR PACKAGE

(71) Applicant: Samsung Electronics Co., Ltd., Suwon-si (KR)

(72) Inventor: Kyoungsoon Cho, Incheon (KR)

(73) Assignee: Samsung Electronics Co., Ltd. (KR)

( * ) Notice: Subject to any disclaimer, the term of this patent is extended or adjusted under 35 U.S.C. 154(b) by 396 days.

(21) Appl. No.: 17/144,286

(22) Filed: Jan. 8, 2021

(65) Prior Publication Data

US 2021/0399033 A1 Dec. 23, 2021

(30) Foreign Application Priority Data

Jun. 23, 2020 (KR) .................. 10-2020-0076238

(51) Int. Cl.
*H01L 27/14* (2006.01)
*H01L 27/146* (2006.01)
*H04N 25/76* (2023.01)

(52) U.S. Cl.
CPC ....... *H01L 27/14618* (2013.01); *H04N 25/76* (2023.01)

(58) Field of Classification Search
CPC .......... H01L 27/14618; H01L 27/1462; H01L 27/14625; H04N 25/76
See application file for complete search history.

(56) References Cited

U.S. PATENT DOCUMENTS

| | | | |
|---|---|---|---|
| 6,923,526 B2 | 8/2005 | Silverbrook | |
| 6,923,764 B2 | 8/2005 | Aceti et al. | |
| 7,199,439 B2 | 4/2007 | Farnworth et al. | |
| 7,645,635 B2 | 1/2010 | Wood et al. | |
| 7,719,097 B2 | 5/2010 | Watanabe | |
| 7,786,429 B2 * | 8/2010 | Glenn | H01L 27/14687 257/434 |
| 7,816,750 B2 | 10/2010 | Chua | |
| 7,902,661 B2 | 3/2011 | Smeys et al. | |
| 8,957,410 B2 | 2/2015 | Xiong et al. | |
| 9,368,429 B2 | 6/2016 | Ma et al. | |
| 9,608,029 B2 | 3/2017 | Wong | |
| 9,866,735 B2 | 1/2018 | Mitarai et al. | |
| 2007/0018309 A1 | 1/2007 | Chang et al. | |
| 2007/0090504 A1* | 4/2007 | Chen | H01L 27/14618 257/680 |
| 2010/0013041 A1 | 1/2010 | Bolt | |

(Continued)

FOREIGN PATENT DOCUMENTS

| | | | | |
|---|---|---|---|---|
| CN | 100354883 C | * | 12/2007 | ............. H01L 24/97 |
| CN | 106677455 A | | 5/2017 | |

(Continued)

*Primary Examiner* — S M Sohel Imtiaz

(74) *Attorney, Agent, or Firm* — Fish & Richardson P.C.

(57) ABSTRACT

A CMOS image sensor (CIS) package includes a package substrate, a CIS chip arranged on an upper surface of the package substrate and electrically connected with the package substrate, a glass arranged over the CIS chip, and an adhesive layer interposed between an edge portion of an upper surface of the CIS chip and an edge portion of a lower surface of the glass to attach the glass to the CIS chip. An interlocking recess is provided to at least one of the CIS chip and the glass, and the adhesive layer comprises an interlocking protrusion inserted into the interlocking recess.

21 Claims, 15 Drawing Sheets

(56) References Cited

U.S. PATENT DOCUMENTS

| | | | | |
|---|---|---|---|---|
| 2010/0155917 A1* | 6/2010 | Maruo | ............. | H01L 27/14618 257/E23.18 |
| 2013/0084431 A1* | 4/2013 | Zhao | .................... | G06F 1/1626 156/60 |
| 2013/0242155 A1* | 9/2013 | Oganesian | ........ | H01L 27/14687 348/308 |
| 2017/0261493 A1 | 9/2017 | Bakir et al. | | |

FOREIGN PATENT DOCUMENTS

| | | |
|---|---|---|
| KR | 10-2002-0037623 A | 5/2002 |
| KR | 10-1423136 A | 7/2014 |

* cited by examiner

CMOS IMAGE SENSOR PACKAGE

CROSS-RELATED APPLICATION

This application claims priority under 35 USC § 119 to Korean Patent Application No. 10-2020-0076238, filed on Jun. 23, 2020 in the Korean Intellectual Property Office (KIPO), the contents of which are herein incorporated by reference in their entirety.

BACKGROUND

1. Field

Example embodiments relate to a CMOS image sensor package.

2. Description of the Related Art

Generally, a complementary metal oxide semiconductor (CMOS) image sensor (CIS) package may include a package substrate, a CIS chip, a glass and an adhesive layer. The CIS chip may be arranged on an upper surface of the package substrate. The glass may be arranged over the CIS chip. The adhesive layer may be interposed between edge portions of the CIS chip and the glass to attach the glass to the CIS chip.

According to related art, a reliability test of the CIS package may be performed at a high temperature. During the reliability test, the adhesive layer may be detached from the CIS chip and/or the glass.

SUMMARY

Example embodiments provide a CMOS image sensor package that may be capable of reinforcing adhesion strength of an adhesive layer.

According to an exemplary embodiment of the present invention, a CMOS image sensor (CIS) package includes a package substrate, a CIS chip arranged on an upper surface of the package substrate and electrically connected with the package substrate, the CIS chip including a first interlocking recess formed along an edge portion of an upper surface of the CIS chip, a glass arranged over the CIS chip, the glass including a second interlocking recess formed along an edge portion of a lower surface of the glass, an adhesive layer interposed between the edge portion of the upper surface of the CIS chip and the edge portion of the lower surface of the glass to attach the glass to the CIS chip, the adhesive layer including a first interlocking protrusion inserted into the first interlocking recess and a second interlocking protrusion inserted into the second interlocking recess, and a molding member formed on the upper surface of the package substrate to support the CIS chip and the glass. Each of the first and second interlocking recesses has a width of from about $2/15$ times to about $3/15$ times a width of the adhesion layer. The width of each of the first and second interlocking recesses and the width of the adhesion layer are measured in the same horizontal direction.

According to an exemplary embodiment of the present invention, a CMOS image sensor (CIS) package includes a package substrate, a CIS chip arranged on an upper surface of the package substrate and electrically connected with the package substrate, the CIS chip including a first interlocking recess formed along an edge portion of an upper surface of the CIS chip, a glass arranged over the CIS chip, the glass including a second interlocking recess formed along an edge portion of a lower surface of the glass, an adhesive layer interposed between the edge portion of the upper surface of the CIS chip and the edge portion of the lower surface of the glass to attach the glass to the CIS chip, the adhesive layer including a first interlocking protrusion inserted into the first interlocking recess and a second interlocking protrusion inserted into the second interlocking recess, and a molding member formed on the upper surface of the package substrate to support the CIS chip and the glass.

According to an exemplary embodiment of the present invention, a CMOS image sensor (CIS) package includes a package substrate, a CIS chip arranged on an upper surface of the package substrate and electrically connected with the package substrate, a glass arranged over the CIS chip, and an adhesive layer interposed between an edge portion of an upper surface of the CIS chip and an edge portion of a lower surface of the glass to attach the glass to the CIS chip. An interlocking recess is provided to at least one of the CIS chip and the glass, and the adhesive layer comprises an interlocking protrusion inserted into the interlocking recess.

According to example embodiments, the at least one interlocking recess may be provided to at least one of the CIS chip and the glass. The adhesive layer may include at least one interlocking protrusion inserted into at least one interlocking recess. Thus, a contact area between the adhesive layer and the CIS chip and/or the glass may be increased to reinforce adhesion strength of the adhesive layer. As a result, under testing the CIS package at a high temperature, the adhesive layer is not detached from the CIS chip and/or the glass.

BRIEF DESCRIPTION OF THE DRAWINGS

Example embodiments will be more clearly understood from the following detailed description taken in conjunction with the accompanying drawings.

FIG. 1 is a cross-sectional view illustrating a CIS package in accordance with example embodiments;

FIG. 2 is an enlarged cross-sectional view of a portion "A" in FIG. 1;

FIG. 3 is a plan view illustrating a CIS chip of the CIS package in FIG. 1;

FIG. 4 is a bottom view illustrating an adhesive layer of the CIS package in FIG. 1;

FIG. 5 is a cross-sectional view illustrating a CIS package in accordance with example embodiments;

FIG. 6 is a plan view illustrating a CIS chip of the CIS package in FIG. 5;

FIG. 7 is a bottom view illustrating an adhesive layer of the CIS package in FIG. 5;

FIG. 8 is a plan view illustrating a CIS chip of a CIS package in accordance with example embodiments;

FIG. 9 is a bottom view illustrating an adhesive layer attached to the CIS chip in FIG. 8;

FIG. 10 is a cross-sectional view illustrating a CIS package in accordance with example embodiments;

FIG. 11 is an enlarged cross-sectional view of a portion "B" in FIG. 10;

FIG. 12 is a cross-sectional view illustrating a CIS package in accordance with example embodiments;

FIG. 13 is an enlarged cross-sectional view of a portion "C" in FIG. 12;

FIG. 14 is a cross-sectional view illustrating a CIS package in accordance with example embodiments;

FIG. 15 is an enlarged cross-sectional view of a portion "D" in FIG. 14;

FIG. 16 is a cross-sectional view illustrating a CIS package in accordance with example embodiments;

FIG. 17 is an enlarged cross-sectional view of a portion "E" in FIG. 16;

FIG. 18 is a cross-sectional view illustrating a CIS package in accordance with example embodiments;

FIG. 19 is a bottom view illustrating a glass of the CIS package in FIG. 18;

FIG. 20 is a plan view illustrating an adhesive layer of the CIS package in FIG. 18;

FIG. 21 is a cross-sectional view illustrating a CIS package in accordance with example embodiments;

FIG. 22 is a bottom view illustrating a glass of the CIS package in FIG. 21;

FIG. 23 is a plan view illustrating an adhesive layer of the CIS package in FIG. 21;

FIG. 24 is a bottom view illustrating a glass of a CIS package in accordance with example embodiments;

FIG. 25 is a plan view illustrating an adhesive layer attached to the glass in FIG. 24; and FIG. 26 is a cross-sectional view illustrating a CIS package in accordance with example embodiments.

DETAILED DESCRIPTION OF THE EMBODIMENTS

Hereinafter, example embodiments will be explained in detail with reference to the accompanying drawings.

Figure 1:
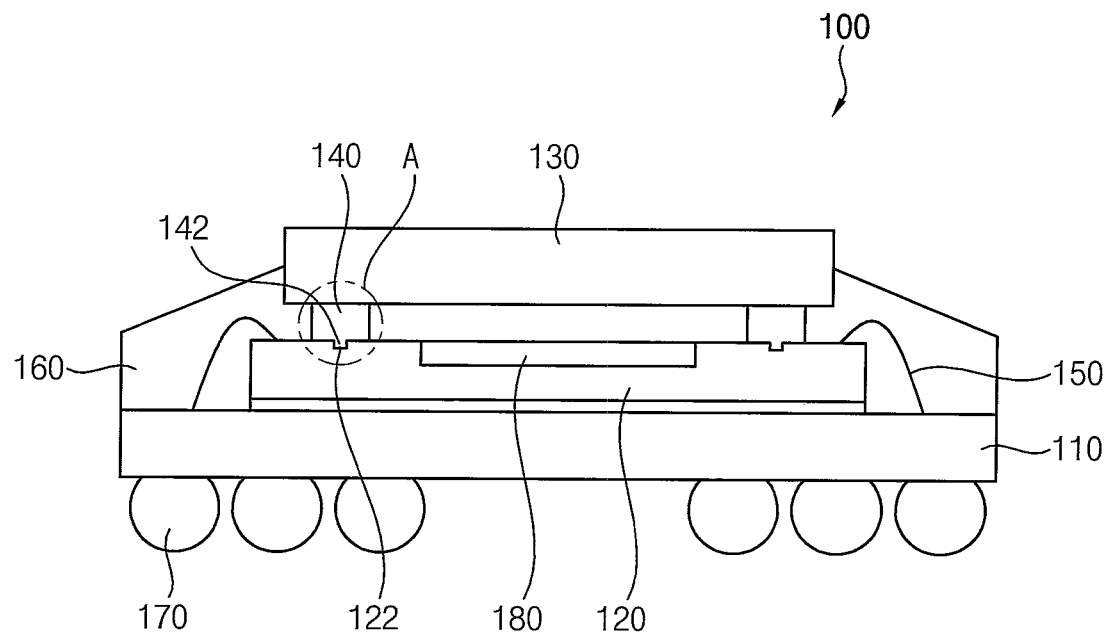
FIGS. 1 to 26 represent non-limiting, example embodiments as described herein.
Figure 2:
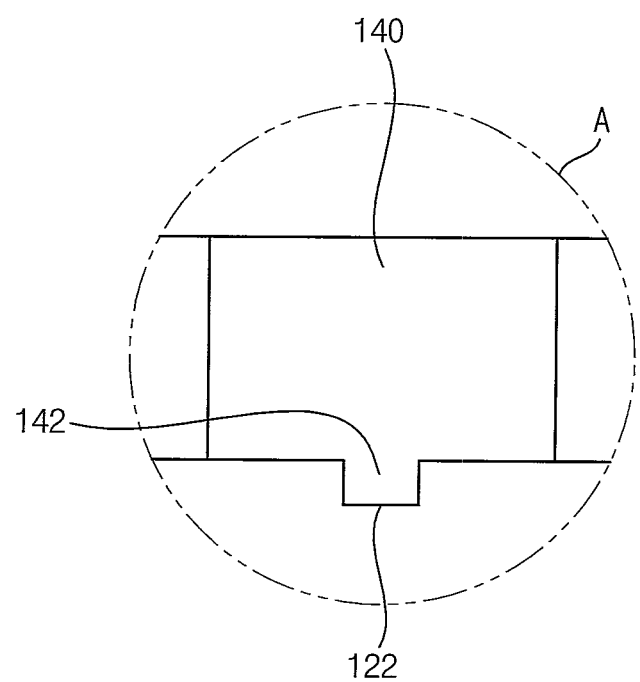
Figure 3:
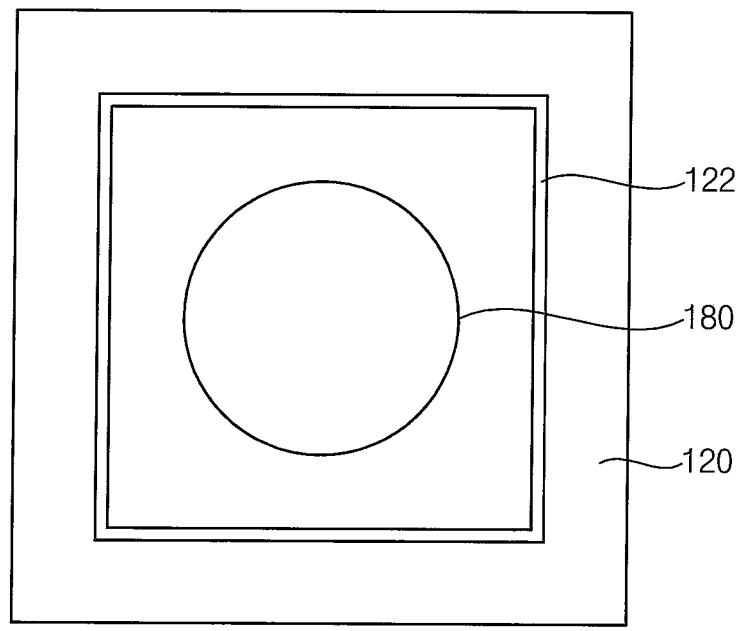
Figure 4:
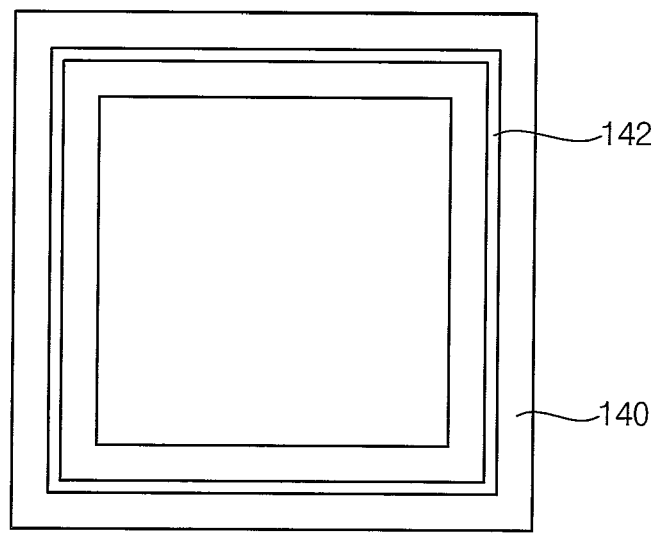

FIG. 1 is a cross-sectional view illustrating a CIS package in accordance with example embodiments, FIG. 2 is an enlarged cross-sectional view of a portion "A" in FIG. 1, FIG. 3 is a plan view illustrating a CIS chip of the CIS package in FIG. 1, and FIG. 4 is a bottom view illustrating an adhesive layer of the CIS package in FIG. 1.

Referring to FIGS. 1 to 4, a CIS package 100 of this example embodiment may include a package substrate 110, a CIS chip 120, a conductive wire 150, a glass 130, an adhesive layer 140, a molding member 160 and external terminals 170.

The package substrate 110 may include a core insulation layer, a conductive pattern, an upper insulation pattern and a lower insulation pattern. The core insulation layer, the upper insulation pattern and the lower insulation pattern may include insulation materials.

The conductive pattern may include an upper conductive pattern, a lower conductive pattern and conductive lines. The upper conductive pattern may be formed on an upper surface of the core insulation layer. The lower conductive pattern may be arranged on a lower surface of the core insulation layer. The conductive lines may be vertically formed through the core insulation layer to electrically connect the upper conductive pattern and the lower conductive pattern with each other.

The upper insulation pattern may be formed on an upper surface of the core insulation layer. The upper insulation pattern may include a plurality of openings configured to expose the upper conductive pattern.

The lower insulation pattern may be formed on the lower surface of the core insulation layer. The lower insulation pattern may include a plurality of openings configured to expose the lower conductive pattern.

Alternatively, the package substrate 110 may include a single conductive pattern, an upper insulation pattern on an upper surface of the single conductive pattern and a lower insulation pattern on a lower surface of the single conductive pattern.

The CIS chip 120 may be arranged on a central portion of the upper surface of the package substrate 110. The CIS chip 120 may include a plurality of pads. The pads may be arranged on an edge portion of an upper surface of the CIS chip 120. A micro-lens 180 may be arranged on a central portion of the upper surface of the CIS chip 120.

The conductive wire 150 may be configured to electrically connect the CIS chip 120 with the package substrate 110. The conductive wire 150 may be extended from the pad of the CIS chip 120 to the upper conductive pattern of the package substrate 110.

The glass 130 may be arranged over the CIS chip 120. The glass 130 may include a material for allowing a light to pass therethrough. Thus, the light may be incident to the micro-lens 180 through the glass 130.

The adhesive layer 140 may attach the glass 130 to the CIS chip 120. The adhesive layer 140 may be interposed between an edge portion of the upper surface of the CIS chip 120 and an edge portion of a lower surface of the glass 130. Thus, a lower surface of the adhesive layer 140 may be configured to contact the edge portion of the upper surface of the CIS chip 120. An upper surface of the adhesive layer 140 may be configured to contact the edge portion of the lower surface of the glass 130. That is, the adhesive layer 140 may have a rectangular frame shape extended along the edge portion of the upper surface of the CIS chip 120. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

The molding member 160 may be formed on the upper surface of the package substrate 110 to support the CIS chip 120, the adhesive layer 140 and the glass 130. The molding member 160 may be formed on an edge portion of the upper surface of the package substrate 110 to surround side surfaces of each of the CIS chip 120, the adhesive layer 140 and the glass 130. The molding member 160 may include an epoxy molding compound (EMC).

The external terminals 170 may be mounted on the lower surface of the package substrate 110. The external terminals 170 may be electrically connected to the lower conductive pattern of the package substrate 110. The external terminals 170 may include solder balls.

A reliability test may be performed on the CIS package 100 at a high temperature. In order to prevent detachment of the adhesive layer 140 from the CIS chip 120, the CIS chip 120 may include a first supporting groove 122 which may serve as an interlocking recess. The first supporting groove 122 may be formed along the edge portion of the upper surface of the CIS chip 120. In an exemplary embodiment, the first supporting groove 122 may surround the micro-lens 180 of the CIS chip 120. The adhesive layer 140 may include a first supporting portion 142 inserted into the first supporting groove 122. The first supporting portion 142 may protrude from a lower surface of the adhesive layer 140. The first supporting portion 142 may serve as an interlocking protrusion. In an exemplary embodiment, the interlocking recess (e.g., the first supporting portion 142) and the interlocking protrusion (e.g., the first supporting groove 122)

may interlock with each other such the interlocking protrusion may be inserted into the interlocking recess.

A contact area between the adhesive layer 140 and the CIS chip 120 may be greatly increased by the first supporting portion 142 inserted into the first supporting groove 122. Thus, adhesion force of the adhesive layer 140 may be reinforced to prevent the detachment of the adhesive layer 140 from the CIS chip 120.

In example embodiments, the first supporting groove 122 may be arranged in one row formed along the edge portion of the upper surface of the CIS chip 120. The first supporting groove 122 may have a rectangular vertical cross-sectional shape. Thus, the first supporting portion 142 may also have a rectangular vertical cross-sectional shape arranged in one row.

Further, the adhesive layer 140 may have a width of about 150 μm. The first supporting groove 122 may have a width of from about 20 μm to about 30 μm. Thus, the width (in a horizontal direction) of the first supporting groove 122 may range from about ²⁄₁₅ to about ³⁄₁₅ times the width (in the same horizontal direction) of the adhesive layer 140. The width of the first supporting groove 122 may therefore be wide enough to provide adequate support to serve as an interlocking mechanism, without being so wide that it requires a substantially greater amount of adhesive. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Figure 5:
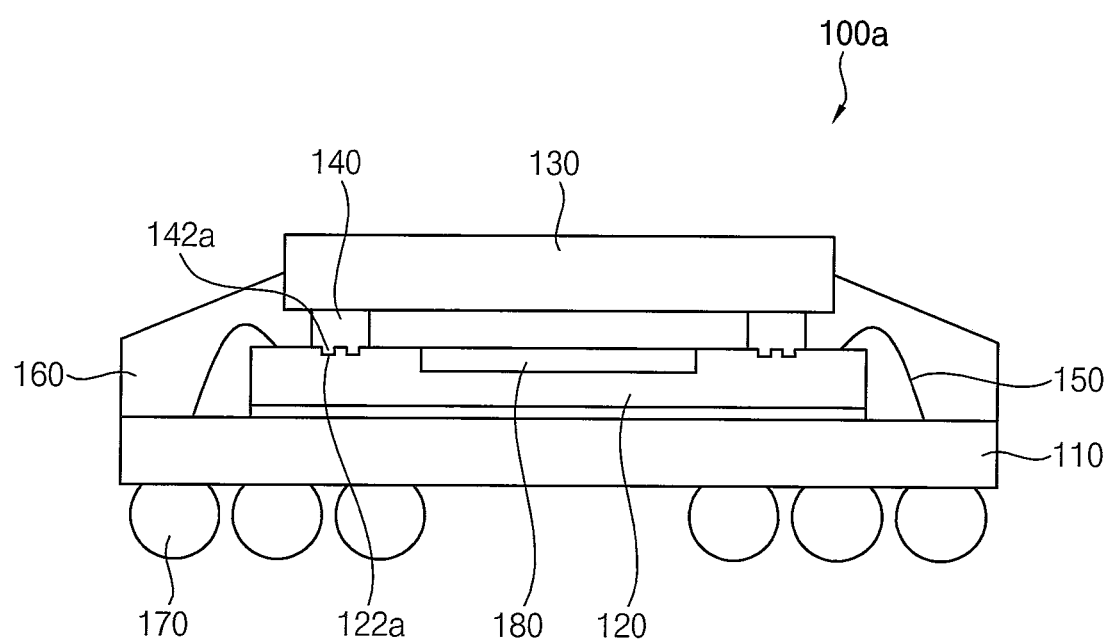
Figure 6:
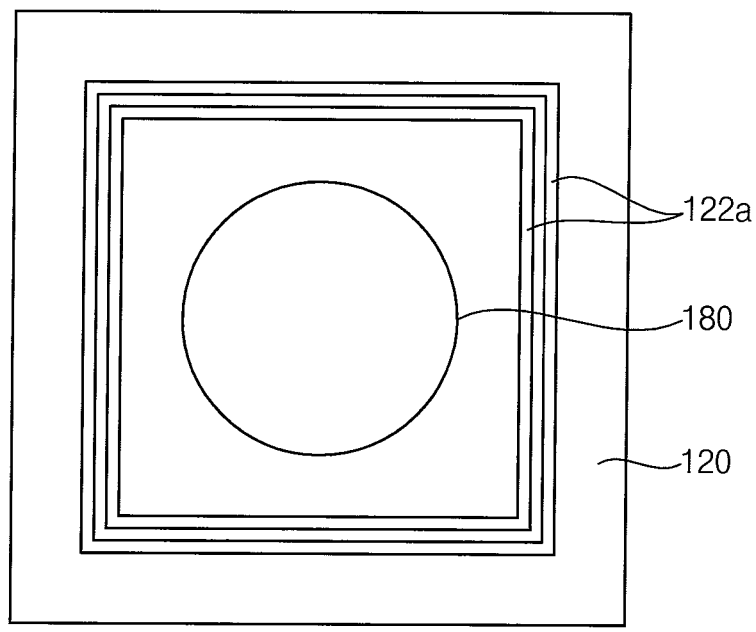
Figure 7:
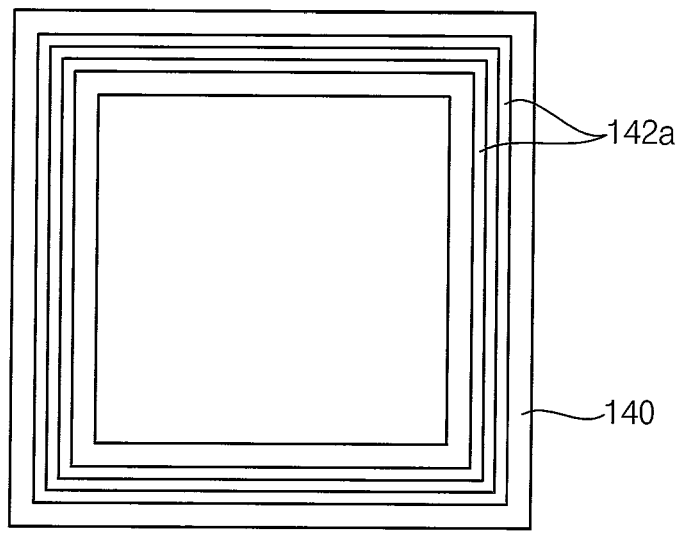

FIG. 5 is a cross-sectional view illustrating a CIS package in accordance with example embodiments, FIG. 6 is a plan view illustrating a CIS chip of the CIS package in FIG. 5, and FIG. 7 is a bottom view illustrating an adhesive layer of the CIS package in FIG. 5.

A CIS package 100a of this example embodiment may include elements substantially the same as those of the CIS package 100 in FIG. 1 except for a first supporting groove and a first supporting portion. Thus, the same reference numerals may refer to the same elements and any further illustrations with respect to the same elements may be omitted herein for brevity.

Referring to FIGS. 5 to 7, a first supporting groove 122a of this example embodiment may be arranged in two rows. The first supporting groove 122a that may be arranged in two rows may serve as an interlocking recess. A first supporting portion 142a inserted into the two first supporting groove 122a may also be arranged in two rows. The first supporting portion 142a that may be arranged in two rows may serve as an interlocking protrusion.

Because the first supporting groove 122a and the first supporting portion 142a may include the two rows, the contact area between the CIS chip 120 and the adhesive layer 140 may increase compared to each of the first supporting groove 122a and the first supporting portion 142a having a single row of FIG. 1.

Alternatively, the first supporting groove 122a and the first supporting portion 142a may include at least three rows.

Figure 8:
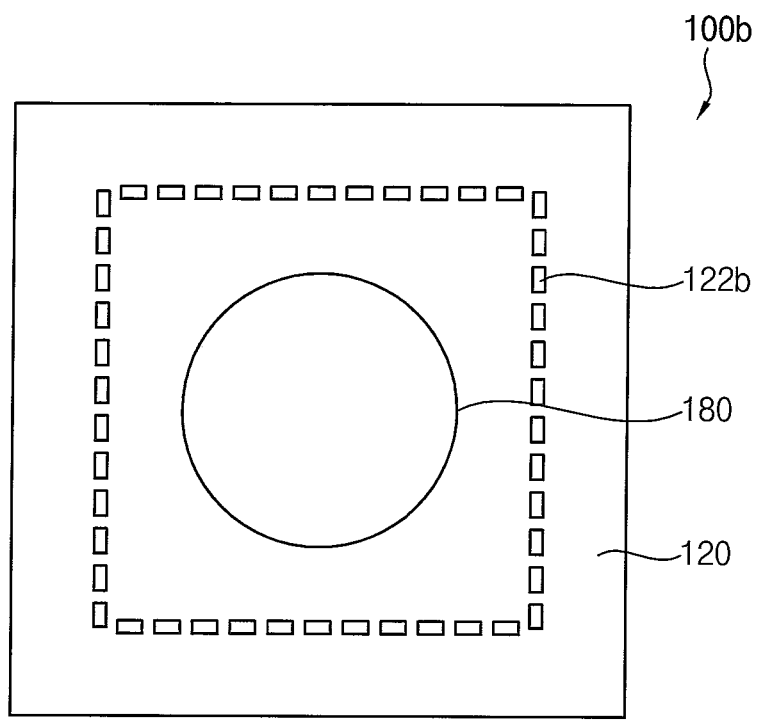
Figure 9:
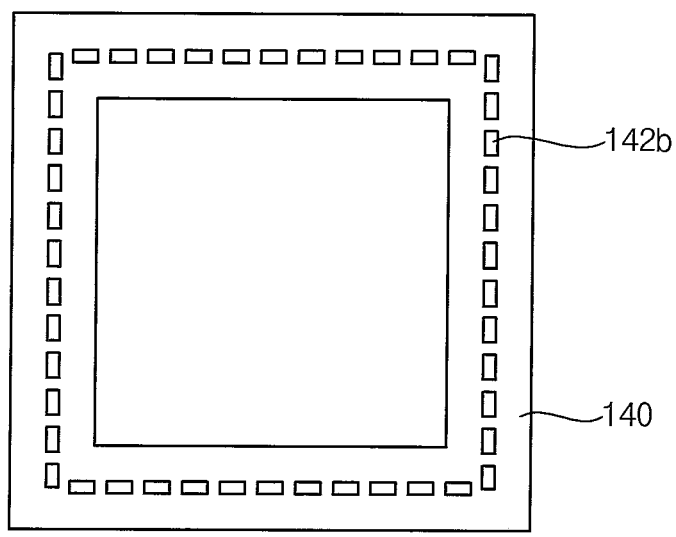

FIG. 8 is a plan view illustrating a CIS chip of a CIS package in accordance with example embodiments, and FIG. 9 is a bottom view illustrating an adhesive layer attached to the CIS chip in FIG. 8.

A CIS package 100b of this example embodiment may include elements substantially the same as those of the CIS package 100 in FIG. 1 except for a first supporting groove and a first supporting portion. Thus, the same reference numerals may refer to the same elements and any further illustrations with respect to the same elements may be omitted herein for brevity.

Referring to FIGS. 8 and 9, a plurality of first recessed patterns 122b may be provided as an interlocking recess. The plurality of first recessed patterns 122b may be spaced apart from each other. The plurality of first recessed patterns 122b may be spaced apart from each other along the edge portion of the CIS chip 120. A plurality of first supporting portions 142b inserted into the first recessed patterns 122b may be spaced apart from each other. The plurality of first supporting portions 142b may serve as an interlocking protrusion. Gaps between the first recessed patterns 122b or gaps between the first supporting portions 142b may be uniform or non-uniform.

Because the first recessed patterns 122b and the first supporting portions 142b may include a plurality of recessed patterns and a plurality of protrusions, the first recessed patterns 122b and the first supporting portions 142b may form an uneven structure. Thus, the adhesion strength of the adhesive layer 140 may be more reinforced due to the uneven structure as well as the increased contact area between the CIS chip 120 and the adhesive layer 140.

Figure 10:
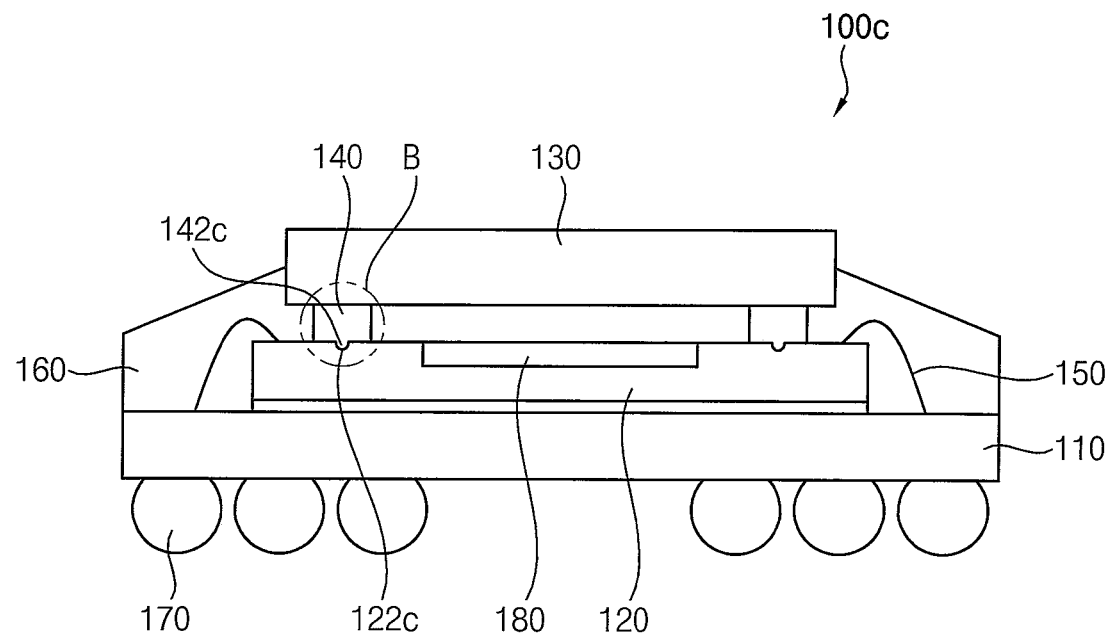
Figure 11:
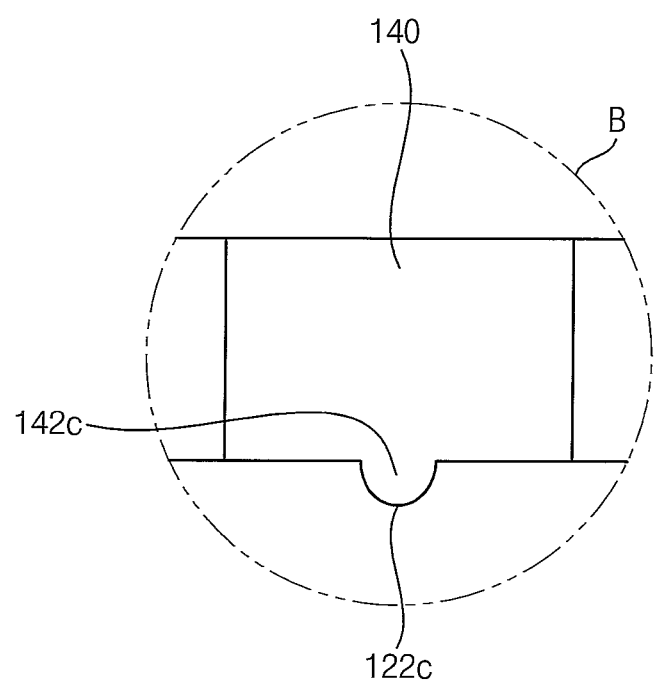

FIG. 10 is a cross-sectional view illustrating a CIS package in accordance with example embodiments, and FIG. 11 is an enlarged cross-sectional view of a portion "B" in FIG. 10.

A CIS package 100c of this example embodiment may include elements substantially the same as those of the CIS package 100 in FIG. 1 except for shapes of a first supporting groove and a first supporting portion. Thus, the same reference numerals may refer to the same elements and any further illustrations with respect to the same elements may be omitted herein for brevity.

Referring to FIGS. 10 and 11, a first interlocking recess 122c of this example embodiment may have a semi-circular vertical cross-sectional shape. A first interlocking protrusion 142c inserted into the first interlocking recess 122c may also have a semi-circular vertical cross-sectional shape.

The first interlocking recess 122c may have the single groove 122 of FIG. 3, at least two grooves 112a of FIG. 6, or the plurality of first recess patterns 122b of FIG. 8. The interlocking protrusion 142c may have the first supporting portion 142 of FIG. 4, the first supporting portion 142a having at least two rows of FIG. 6, or the plurality of first supporting portions 142b of FIG. 9.

Figure 12:
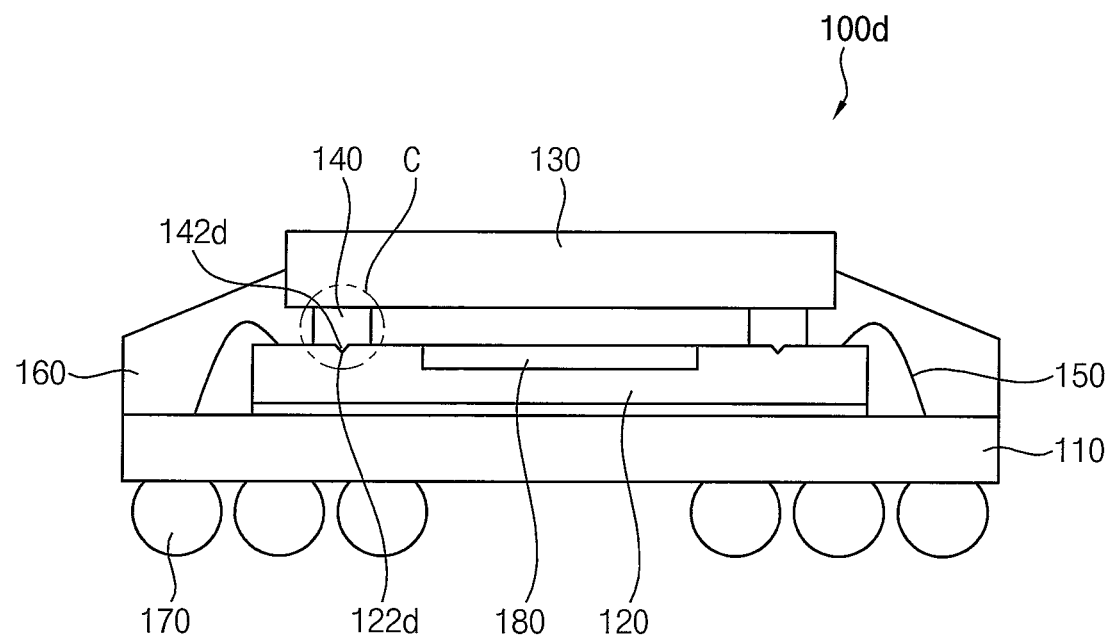
Figure 13:
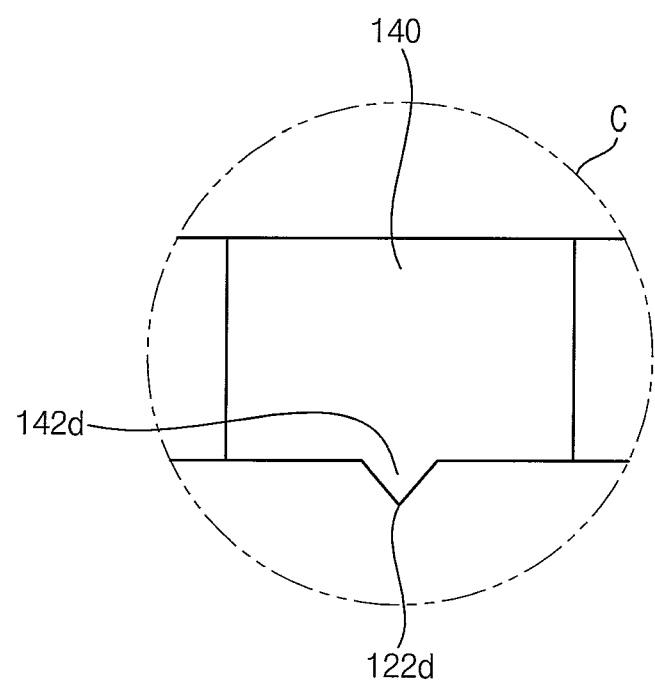

FIG. 12 is a cross-sectional view illustrating a CIS package in accordance with example embodiments, and FIG. 13 is an enlarged cross-sectional view of a portion "C" in FIG. 12.

A CIS package 100d of this example embodiment may include elements substantially the same as those of the CIS package 100 in FIG. 1 except for shapes of a first supporting groove and a first supporting portion. Thus, the same reference numerals may refer to the same elements and any further illustrations with respect to the same elements may be omitted herein for brevity.

Referring to FIGS. 12 and 13, a first interlocking recess 122d of this example embodiment may have a triangular vertical cross-sectional shape. A first interlocking protrusion 142d inserted into the first interlocking recess 122d may also have a triangular vertical cross-sectional shape.

The first interlocking recess 122d may have the single groove 122 of FIG. 3, at least two grooves 112a of FIG. 6, or the plurality of first recess patterns 122b of FIG. 8. The interlocking protrusion 142*d* may have the first supporting portion 142 of FIG. 4, the first supporting portion 142*a* having at least two rows of FIG. 6, or the plurality of first supporting portions 142*b* of FIG. 9.

Figure 14:
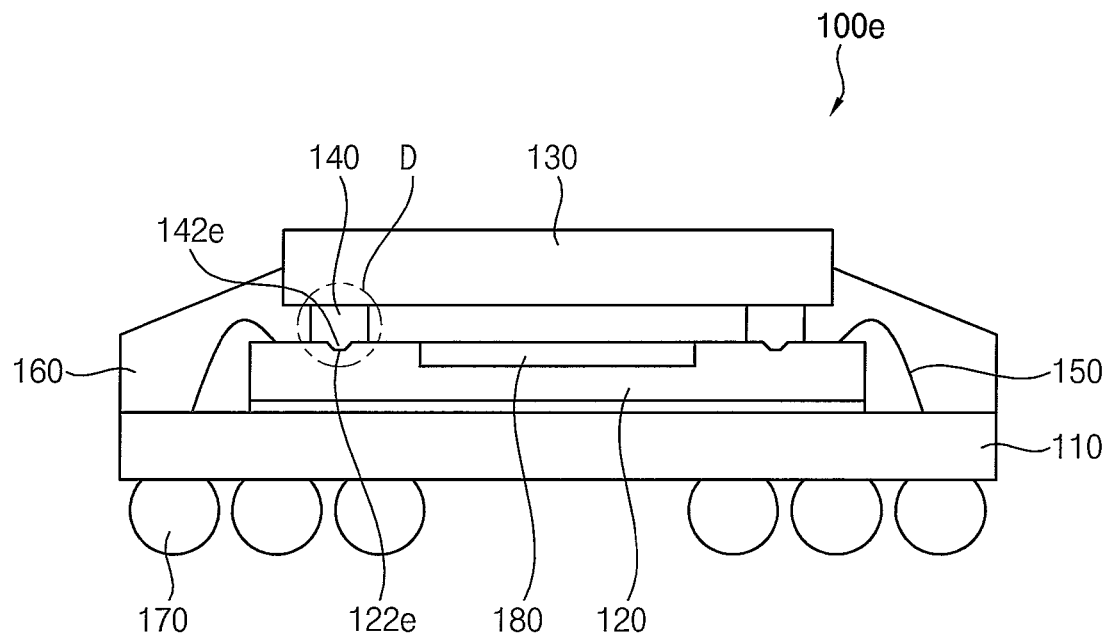
Figure 15:
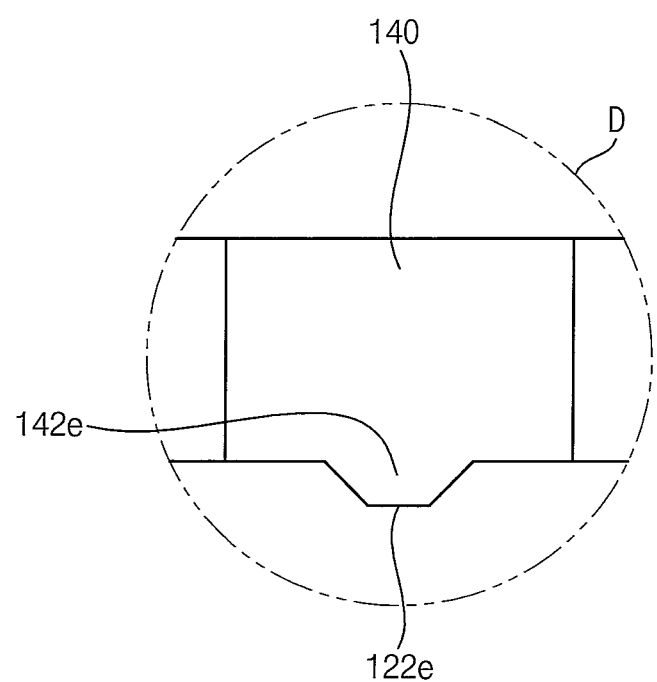

FIG. 14 is a cross-sectional view illustrating a CIS package in accordance with example embodiments, and FIG. 15 is an enlarged cross-sectional view of a portion "D" in FIG. 14.

A CIS package 100*e* of this example embodiment may include elements substantially the same as those of the CIS package 100 in FIG. 1 except for shapes of a first supporting groove and a first supporting portion. Thus, the same reference numerals may refer to the same elements and any further illustrations with respect to the same elements may be omitted herein for brevity.

Referring to FIGS. 14 and 15, a first interlocking recess 122*e* of this example embodiment may have a trapezoidal vertical cross-sectional shape. A first interlocking protrusion 142*e* inserted into the first interlocking recess 122*e* may also have a trapezoidal vertical cross-sectional shape.

The first interlocking recess 122*e* may have the single groove 122 of FIG. 3, at least two grooves 112*a* of FIG. 6, or the plurality of first recess patterns 122*b* of FIG. 8. The first interlocking protrusion 142*e* may have the first supporting portion 142 of FIG. 4, the first supporting portion 142*a* having at least two rows of FIG. 6, or the plurality of first supporting portions 142*b* of FIG. 9.

Figure 16:
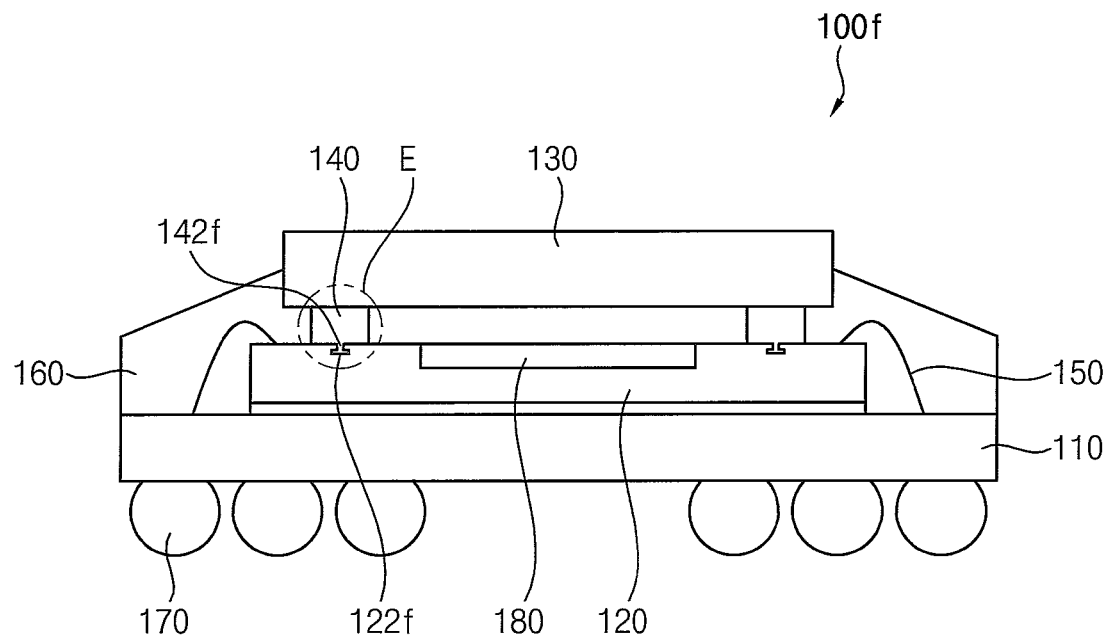
Figure 17:
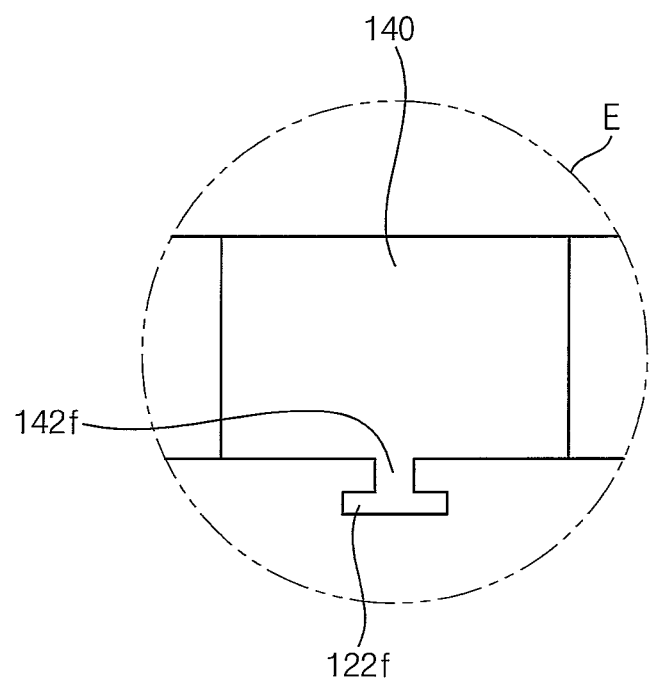

FIG. 16 is a cross-sectional view illustrating a CIS package in accordance with example embodiments, and FIG. 17 is an enlarged cross-sectional view of a portion "E" in FIG. 16.

A CIS package 100*f* of this example embodiment may include elements substantially the same as those of the CIS package 100 in FIG. 1 except for shapes of a first supporting groove and a first supporting portion. Thus, the same reference numerals may refer to the same elements and any further illustrations with respect to the same elements may be omitted herein for brevity.

Referring to FIGS. 16 and 17, a first interlocking recess 122*f* of this example embodiment may have a cross-section having a reversed T-shape. A first interlocking protrusion 142*f* inserted into the first interlocking recess 122*f* may also have a cross-section of a reversed T-shape. The first interlocking recess 122*f* may have the single groove 122 of FIG. 3, at least two grooves 112*a* of FIG. 6, or the plurality of first recess patterns 122*b* of FIG. 8. The first interlocking protrusion 142*f* may have the first supporting portion 142 of FIG. 4, the first supporting portion 142*a* having at least two rows of FIG. 6, or the plurality of first supporting portions 142*b* of FIG. 9.

Figure 18:
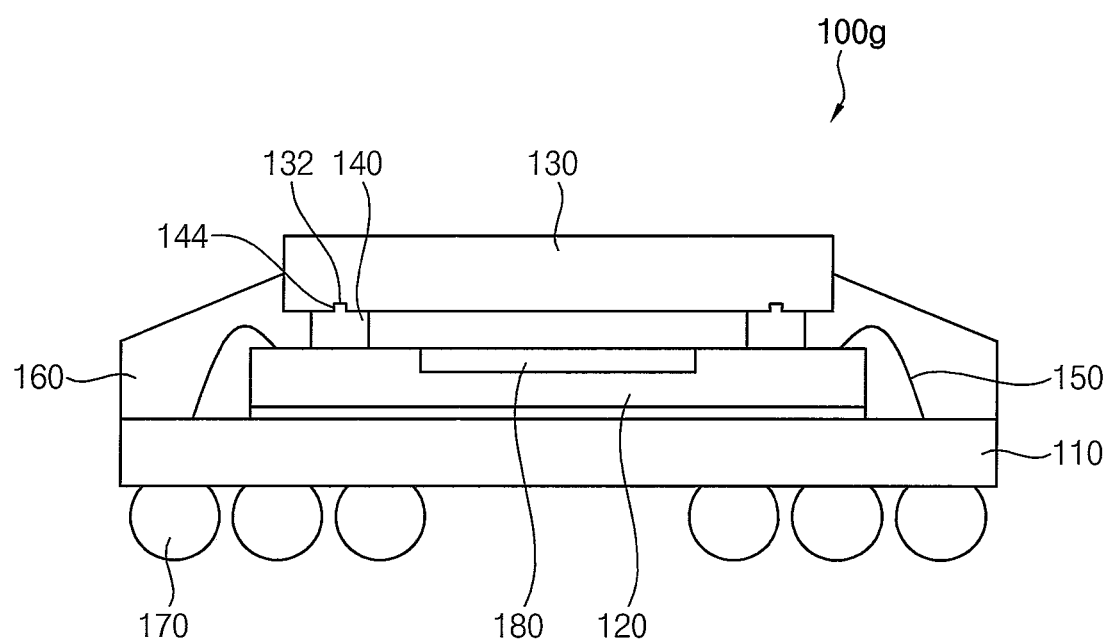
Figure 19:
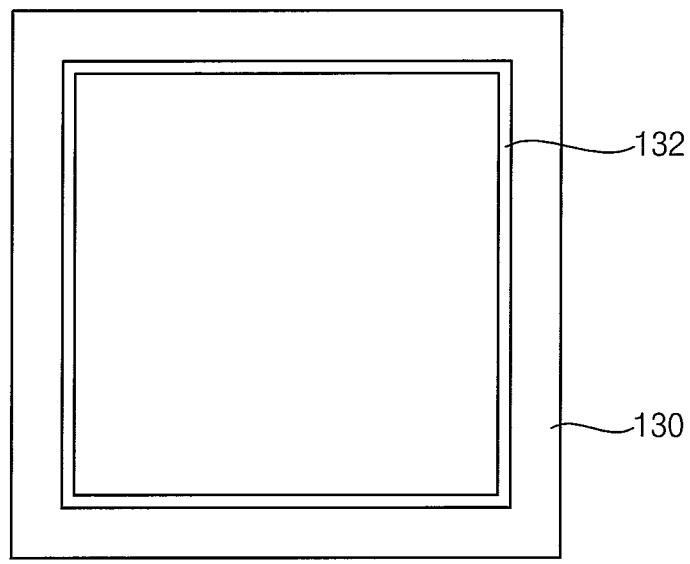
Figure 20:
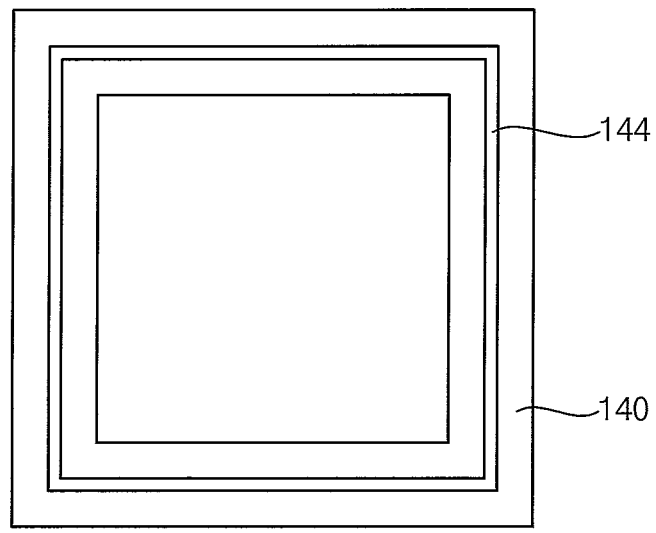

FIG. 18 is a cross-sectional view illustrating a CIS package in accordance with example embodiments, FIG. 19 is a bottom view illustrating a glass of the CIS package in FIG. 18, and FIG. 20 is a plan view illustrating an adhesive layer of the CIS package in FIG. 18.

Referring to FIGS. 18 to 20, a CIS package 100*g* of this example embodiment may include a package substrate 110, a CIS chip 120, a conductive wire 150, a glass 130, an adhesive layer 140, a molding member 160 and external terminals 170.

The CIS chip 120 may be arranged on a central portion of the upper surface of the package substrate 110. The CIS chip 120 may include a plurality of pads. The pads may be arranged on an edge portion of an upper surface of the CIS chip 120. Micro-lens 180 may be arranged on a central portion of the upper surface of the CIS chip 120. The conductive wire 150 may be configured to electrically connect the CIS chip 120 with the package substrate 110.

The glass 130 may be arranged over the CIS chip 120. The glass 130 may include a material for allowing a light to pass therethrough. Thus, the light may be incident to the micro-lens 180 through the glass 130.

The adhesive layer 140 may attach the glass 130 to the CIS chip 120. The adhesive layer 140 may be interposed between an edge portion of the upper surface of the CIS chip 120 and an edge portion of a lower surface of the glass 130. Thus, a lower surface of the adhesive layer 140 may be configured to contact the edge portion of the upper surface of the CIS chip 120. An upper surface of the adhesive layer 140 may be configured to contact the edge portion of the lower surface of the glass 130. That is, the adhesive layer 140 may have a rectangular frame shape extended along the edge portion of the upper surface of the CIS chip 120.

The molding member 160 may be formed on the upper surface of the package substrate 110 to support the CIS chip 120, the adhesive layer 140 and the glass 130. The molding member 160 may be formed on an edge portion of the upper surface of the package substrate 110 to surround side surfaces of the CIS chip 120, the adhesive layer 140 and the glass 130. The molding member 160 may include an epoxy molding compound (EMC).

The external terminals 170 may be mounted on the lower surface of the package substrate 110. The external terminals 170 may be electrically connected to the lower conductive pattern of the package substrate 110. The external terminals 170 may include solder balls.

A reliability test may be performed on the CIS package 100 at a high temperature. In order to prevent a detachment of the adhesive layer 140 from the glass 130, the glass 130 may include a second supporting groove 132 which serves as a second interlocking recess. The second supporting groove 132 may be formed along the edge portion of the lower surface of the glass 130. The adhesive layer 140 may include a second supporting portion 144 inserted into the second supporting groove 132. The second supporting portion 144 may serve as a second interlocking protrusion. The second supporting portion 144 may be formed to protrude from the upper surface of the adhesive layer 140. In an exemplary embodiment, the second interlocking protrusion (e.g., the second supporting portion 144) and the second interlocking recess (e.g., the second supporting groove 132) may interlock with each other such that the second interlocking protrusion of the adhesive layer 140 may be inserted into the second interlocking recess.

A contact area between the adhesive layer 140 and the glass 130 may be greatly increased by the second supporting portion 144 inserted into the second supporting groove 132. Thus, adhesion force of the adhesive layer 140 may be reinforced to prevent the detachment of the adhesive layer 140 from the glass 130.

In example embodiments, the second supporting groove 132 may be arranged in one row formed along the edge portion of the lower surface of the glass 130. Further, the second supporting groove 132 may have a rectangular vertical cross-sectional shape. Thus, the second supporting portion 144 may also have a rectangular vertical cross-sectional shape arranged in one row.

Further, the adhesive layer 140 may have a width of about 150 μm. The second supporting groove 132 may have a width of from about 20 μm to about 30 μm. Thus, the width of the second supporting groove 132 may range from about 2/15 to about 3/15 times the width of the adhesive layer 140.

Alternatively, the second supporting groove 132 and the second supporting portion 144 may have the shape in FIG. 10, the shape in FIG. 12, the shape in FIG. 14 or the shape in FIG. 16.

Figure 21:
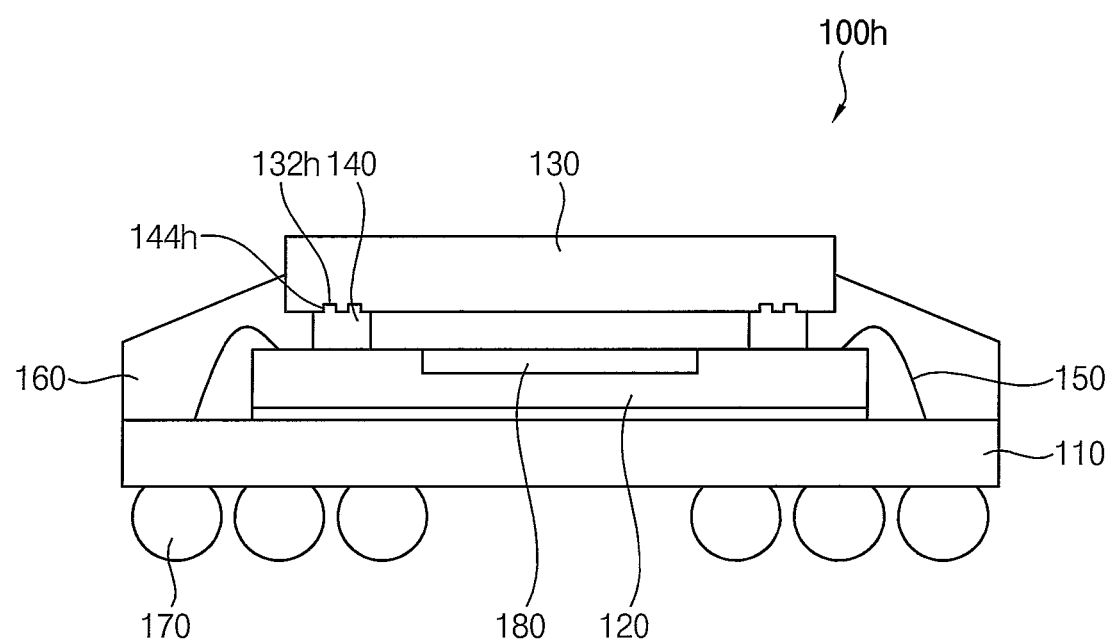
Figure 22:
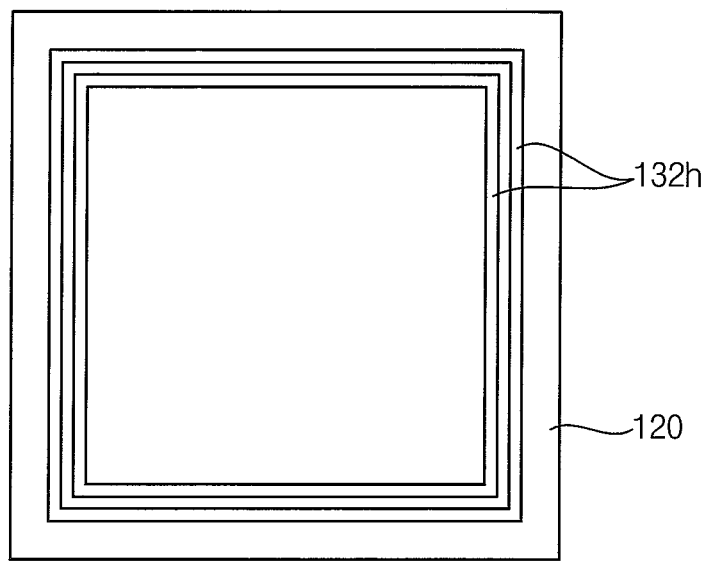
Figure 23:
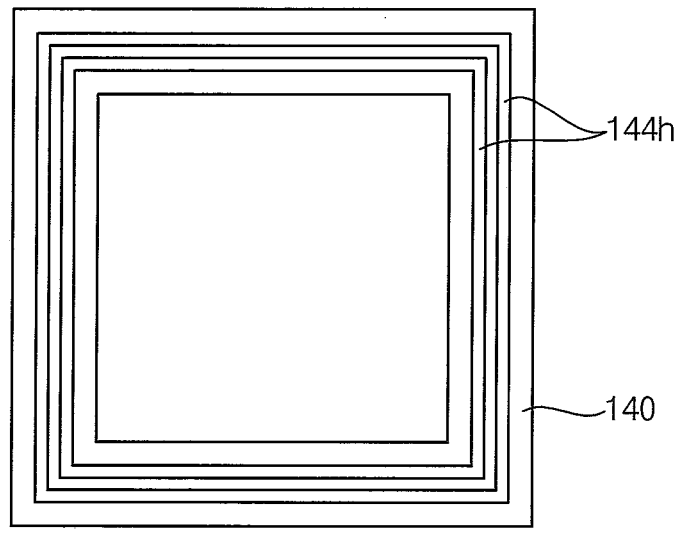

FIG. 21 is a cross-sectional view illustrating a CIS package in accordance with example embodiments, FIG. 22 is a bottom view illustrating a glass of the CIS package in FIG. 21, and FIG. 23 is a plan view illustrating an adhesive layer of the CIS package in FIG. 21.

A CIS package 100h of this example embodiment may include elements substantially the same as those of the CIS package 100g in FIG. 18 except for a second supporting groove and a second supporting portion. Thus, the same reference numerals may refer to the same elements and any further illustrations with respect to the same elements may be omitted herein for brevity.

Referring to FIGS. 21 to 23, a second supporting groove 132h of this example embodiment may be arranged in two rows. The second supporting groove 132h that is arranged in two rows may serve as an interlocking recess. A second supporting portion 144h that is inserted into the second supporting groove 132h may also be arranged in two rows. The second supporting portion 144h that is arranged in two rows may serve as an interlocking protrusion.

Because the second supporting groove 132h and the second supporting portion 144h may include the two rows, the contact area between the glass 130 and the adhesive layer 140 may be more increased.

Alternatively, the second supporting groove 132h and the second supporting portion 144h may have the shape in FIG. 10, the shape in FIG. 12, the shape in FIG. 14 or the shape in FIG. 16.

Figure 24:
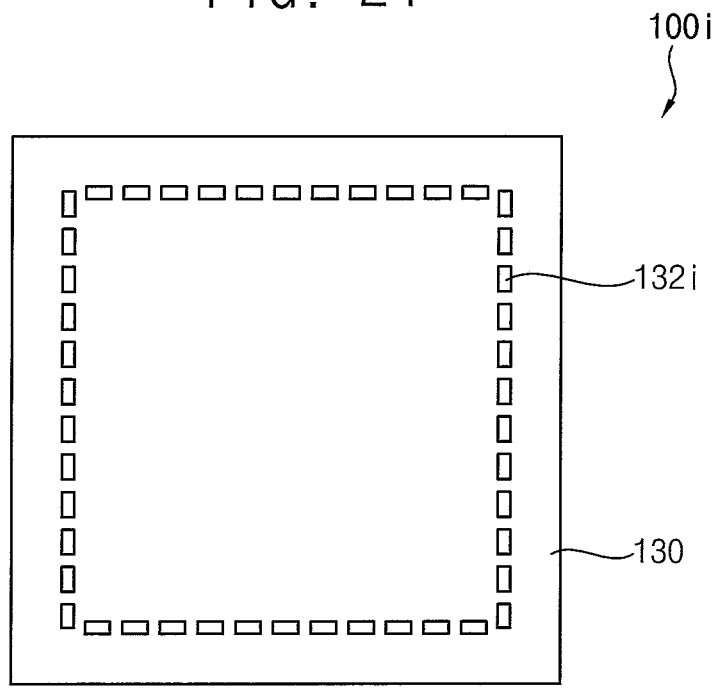
Figure 25:
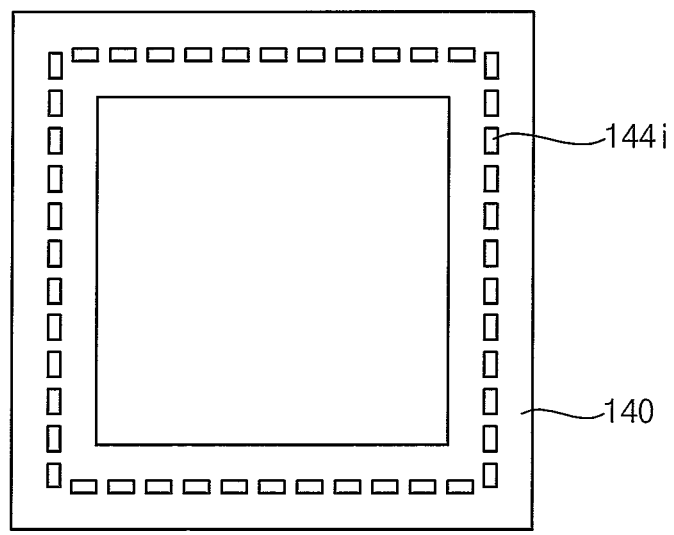

FIG. 24 is a bottom view illustrating a glass of a CIS package in accordance with example embodiments, and FIG. 25 is a plan view illustrating an adhesive layer attached to the glass in FIG. 24.

A CIS package 100i of this example embodiment may include elements substantially the same as those of the CIS package 100g in FIG. 18 except for a first supporting groove and a second supporting portion. Thus, the same reference numerals may refer to the same elements and any further illustrations with respect to the same elements may be omitted herein for brevity.

Referring to FIGS. 24 and 25, a plurality of second recessed patterns 132i may be provided as an interlocking recess. The plurality of second recessed patterns 132i may be spaced apart from each other. The plurality of second recessed patterns 132i may be spaced apart from each other along the edge portion of the lower surface of the glass 130. The plurality of second supporting portions 144i that are inserted into the second recessed patterns 132i may be spaced apart from each other. The plurality of second supporting portions 144i may serve as an interlocking protrusion.

Because the second recessed patterns 132i and the second supporting portions 144i may include a plurality of recessed patterns and a plurality of protrusions, the second recessed patterns 132i and the second supporting portions 144i may form an uneven structure. Thus, the adhesion strength of the adhesive layer 140 may be more reinforced due to the uneven structure as well as the increased contact area between the glass 130 and the adhesive layer 140.

Alternatively, the second supporting groove 132h and the second supporting portion 144h may have the shape in FIG. 10, the shape in FIG. 12, the shape in FIG. 14 or the shape in FIG. 16.

Figure 26:
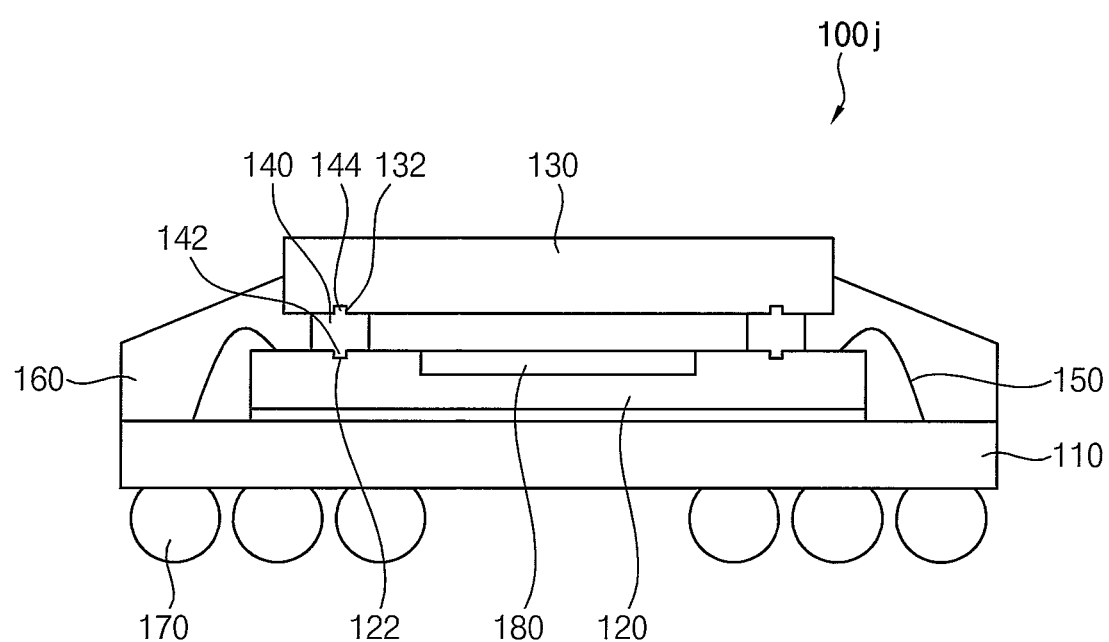

FIG. 26 is a cross-sectional view illustrating a CIS package in accordance with example embodiments.

Referring to FIG. 26, a CIS package 100j of this example embodiment may include a package substrate 110, a CIS chip 120, a conductive wire 150, a glass 130, an adhesive layer 140, a molding member 160 and external terminals 170.

The CIS chip 120 may be arranged on a central portion of the upper surface of the package substrate 110. The CIS chip 120 may include a plurality of pads. The pads may be arranged on an edge portion of an upper surface of the CIS chip 120. A micro-lens 180 may be arranged on a central portion of the upper surface of the CIS chip 120. The conductive wire 150 may be configured to electrically connect the CIS chip 120 with the package substrate 110.

The glass 130 may be arranged over the CIS chip 120. The glass 130 may include a material for allowing a light to pass therethrough. Thus, the light may be incident to the micro-lens 180 through the glass 130.

The adhesive layer 140 may attach the glass 130 to the CIS chip 120. The adhesive layer 140 may be interposed between an edge portion of the upper surface of the CIS chip 120 and an edge portion of a lower surface of the glass 130. Thus, a lower surface of the adhesive layer 140 may be configured to contact the edge portion of the upper surface of the CIS chip 120. An upper surface of the adhesive layer 140 may be configured to contact the edge portion of the lower surface of the glass 130. That is, the adhesive layer 140 may have a rectangular frame shape extended along the edge portion of the upper surface of the CIS chip 120.

The molding member 160 may be formed on the upper surface of the package substrate 110 to support the CIS chip 120, the adhesive layer 140 and the glass 130. The molding member 160 may be formed on an edge portion of the upper surface of the package substrate 110 to surround side surfaces of the CIS chip 120, the adhesive layer 140 and the glass 130. The molding member 160 may include an epoxy molding compound (EMC).

The external terminals 170 may be mounted on the lower surface of the package substrate 110. The external terminals 170 may be electrically connected to the lower conductive pattern of the package substrate 110. The external terminals 170 may include solder balls.

A reliability test may be performed on the CIS package 100 at a high temperature. In order to prevent detachment of the adhesive layer 140 from the CIS chip and the glass 130, the CIS chip 120 may include a first interlocking recess 122 and the glass 130 may include a second interlocking recess 132. The first interlocking recess 122 may be formed along the edge portion of the upper surface of the CIS chip 120. The second interlocking recess 132 may be formed along the edge portion of the lower surface of the glass 130. The adhesive layer 140 may include a first interlocking protrusion 142 that is inserted into the first interlocking recess 122 and a second interlocking protrusion 144 that is inserted into the second interlocking recess 132. The first interlocking protrusion 142 may be formed on the lower surface of the adhesive layer 140. The second interlocking protrusion 144 may be formed on the upper surface of the adhesive layer 140. The above-mentioned structure of this example embodiment may have an integration structure of the structure in FIG. 1 and the structure in FIG. 18.

The contact area between the lower surface of the adhesive layer 140 and the CIS chip 120 may be greatly increased by the first interlocking protrusion 142 that is inserted into the first interlocking recess 122, and by the second interlocking protrusion 144 that is inserted into the second interlocking recess 132. Thus, the adhesion force of the adhesive layer 140 may be reinforced to prevent the detachment of the adhesive layer 140 from the CIS chip 120 and the glass 130.

In example embodiments, each of the first interlocking recess 122 and the second interlocking recess 132 may be arranged in one row formed along the edge portion of the upper surface of the CIS chip 120 and the edge portion of the lower surface of the glass 130, respectively. Further, the first interlocking recess 122 and the second interlocking recess 132 may have a rectangular vertical cross-sectional shape. Each of the first interlocking protrusion 142 and the second interlocking protrusion 144 may also have a rectangular vertical cross-sectional shape arranged in one row.

Alternatively, the first and second interlocking recesses 122 and 132 and the first second interlocking protrusions 142 and 144 may have the shape in FIG. 10, the shape in FIG. 12, the shape in FIG. 14 or the shape in FIG. 16. Each of the first and second interlocking recesses 122 and 132 may have the single groove 122 of FIG. 3, at least two grooves 112a of FIG. 6, or the plurality of first recess patterns 122b of FIG. 8. Each of the first and second interlocking protrusions 142 and 144 may have the first supporting portion 142 of FIG. 4, the first supporting portion 142a having at least two rows of FIG. 6, or the plurality of first supporting portions 142b of FIG. 9.

According to example embodiments, at least one interlocking recess may be provided to at least one of the CIS chip and the glass. The adhesive layer may include an interlocking protrusion that is inserted into the interlocking recess. Thus, a contact area between the adhesive layer and the CIS chip and/or the glass may be increased to reinforce adhesion strength of the adhesive layer. As a result, under testing the CIS package at a high temperature, the adhesive layer may be prevented from being detached from the CIS chip and/or the glass. It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A CMOS image sensor (CIS) package comprising:
a package substrate;
a CIS chip arranged on an upper surface of the package substrate and electrically connected with the package substrate, the CIS chip including a first interlocking recess formed along an edge portion of an upper surface of the CIS chip;
a glass arranged over the CIS chip, the glass including a second interlocking recess formed along an edge portion of a lower surface of the glass;
an adhesive layer interposed between the edge portion of the upper surface of the CIS chip and the edge portion of the lower surface of the glass to attach the glass to the CIS chip, the adhesive layer including a first interlocking protrusion inserted into the first interlocking recess and a second interlocking protrusion inserted into the second interlocking recess; and
a molding member formed on the upper surface of the package substrate to support the CIS chip and the glass,
wherein the adhesive layer has an outer side surface positioned inside an outer side surface of the glass, and the outer side surface of the adhesive layer does not protrude from the outer side surface of the glass,
wherein each of the first and second interlocking recesses has a width of from about $2/15$ times to about $3/15$ times a width of the adhesion layer, and
wherein the width of each of the first and second interlocking recesses and the width of the adhesion layer are measured in the same horizontal direction.

2. The CIS package of claim 1,
wherein the first interlocking recess is of a groove shape and is arranged in at least two rows, and
wherein the second interlocking recess is of a groove shape and is arranged in at least two respective rows.

3. The CIS package of claim 1,
wherein the first interlocking recess comprises a plurality of recessed patterns that are spaced apart from each other along the edge portion of the upper surface of the CIS chip, and
wherein the second interlocking recess comprises a plurality of recessed patterns that are spaced apart from each other along the edge portion of the lower surface of the glass.

4. The CIS package of claim 1,
wherein a cross-section of each of the first and second interlocking recesses corresponds to a triangular shape, a rectangular shape, a trapezoidal shape or a semi-circular shape.

5. The CIS package of claim 1, further comprising:
a plurality of external terminals mounted on a lower surface of the package substrate.

6. A CMOS image sensor (CIS) package comprising:
a package substrate;
a CIS chip arranged on an upper surface of the package substrate and electrically connected with the package substrate, the CIS chip including a first interlocking recess formed along an edge portion of an upper surface of the CIS chip;
a glass arranged over the CIS chip, the glass including a second interlocking recess formed along an edge portion of a lower surface of the glass;

an adhesive layer interposed between the edge portion of the upper surface of the CIS chip and the edge portion of the lower surface of the glass to attach the glass to the CIS chip, the adhesive layer including a first interlocking protrusion inserted into the first interlocking recess and a second interlocking protrusion inserted into the second interlocking recess; and a molding member formed on the upper surface of the package substrate to support the CIS chip and the glass, wherein the adhesive layer has an outer side surface positioned inside an outer side surface of the glass, and the outer side surface of the adhesive layer does not protrude from the outer side surface of the glass.

7. The CIS package of claim 6,
wherein the first interlocking recess is of a groove shape and is arranged in at least two rows, and
wherein the second interlocking recess is of a groove shape and is arranged in at least two respective rows.

8. The CIS package of claim 6,
wherein the first interlocking recess comprises a plurality of recessed patterns that are spaced apart from each other along the edge portion of the upper surface of the CIS chip, and
wherein the second interlocking recess comprises a plurality of recessed patterns that are spaced apart from each other along the edge portion of the lower surface of the glass.

9. The CIS package of claim 6,
wherein a cross-section of each of the first and second interlocking recesses corresponds to a triangular shape, a rectangular shape, a trapezoidal shape or a semi-circular shape.

10. The CIS package of claim 6, further comprising:
a plurality of external terminals mounted on a lower surface of the package substrate.

11. A CMOS image sensor (CIS) package comprising:
a package substrate;
a CIS chip arranged on an upper surface of the package substrate and electrically connected with the package substrate;
a glass arranged over the CIS chip; and
an adhesive layer interposed between an edge portion of an upper surface of the CIS chip and an edge portion of a lower surface of the glass to attach the glass to the CIS chip,
wherein an interlocking recess is provided to at least one of the CIS chip and the glass, and the adhesive layer comprises an interlocking protrusion inserted into the interlocking recess, wherein the adhesive layer has an outer side surface positioned inside an outer side surface of the glass, and the outer side surface of the adhesive layer does not protrude from the outer side surface of the glass.

12. The CIS package of claim 11,
wherein the interlocking recess is formed along the edge portion of the upper surface of the CIS chip.

13. The CIS package of claim 12,
wherein the interlocking recess is of a groove shape and is part of at least two first interlocking recesses arranged in at least two respective rows.

14. The CIS package of claim 12,
wherein the interlocking recess comprises a plurality of recess patterns that are spaced apart from each other along the edge portion of the upper surface of the CIS chip.

15. The CIS package of claim 11,
wherein the interlocking recess is formed along the edge portion of the lower surface of the glass.

16. The CIS package of claim 15,
wherein the interlocking recess is part of at least two interlocking recesses arranged in at least two respective rows.

17. The CIS package of claim 15,
wherein the interlocking recess comprises a plurality of recessed patterns that are spaced apart from each other along the edge portion of the upper surface of the CIS chip.

18. The CIS package of claim 11,
wherein a cross-section of the interlocking recess corresponds to a reversed T-shape, and
wherein the interlocking protrusion is inserted into the reversed T-shape of the interlocking recess.

19. The CIS package of claim 11,
wherein a cross-section of the interlocking recess corresponds to a triangular shape, a rectangular shape, a trapezoidal shape or a semi-circular shape.

20. The CIS package of claim 11, further comprising:
a molding member formed on the upper surface of the package substrate to support the CIS chip and the glass; and
a plurality of external terminals mounted on a lower surface of the package substrate.

21. The CIS package of claim 11, wherein the adhesive comprises a portion positioned inside the interlocking recess.

* * * * *